(12) United States Patent
Ahsanullah et al.

(10) Patent No.: US 6,882,200 B2
(45) Date of Patent: Apr. 19, 2005

(54) CONTROLLING SIGNAL STATES AND LEAKAGE CURRENT DURING A SLEEP MODE

(75) Inventors: Zahid Ahsanullah, Austin, TX (US); Michael Longwell, Austin, TX (US); James R. Feddeler, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 551 days.

(21) Appl. No.: 09/911,198

(22) Filed: Jul. 23, 2001

(65) Prior Publication Data

US 2003/0016062 A1 Jan. 23, 2003

(51) Int. Cl.[7] .............................................. H03K 3/12
(52) U.S. Cl. ....................................... 327/199; 327/57
(58) Field of Search .......................... 327/108–112, 51, 327/52, 56–57, 64, 72, 77, 199, 200, 333, 55, 219; 365/195, 196, 205, 207, 230.08; 326/63, 34, 82–87, 94–98

(56) References Cited

U.S. PATENT DOCUMENTS

| | | | |
|---|---|---|---|
| 4,486,670 A | | 12/1984 | Chan et al. .................. 326/81 |
| 5,155,397 A | * | 10/1992 | Fassino et al. ............... 327/54 |
| 5,796,273 A | * | 8/1998 | Jung et al. ................... 327/55 |
| 5,886,541 A | * | 3/1999 | Asato .......................... 326/17 |
| 5,903,171 A | * | 5/1999 | Shieh ........................... 327/55 |
| 6,222,384 B1 | | 4/2001 | Kim ............................. 326/68 |
| 6,259,275 B1 | | 7/2001 | Beiu ........................... 326/112 |

FOREIGN PATENT DOCUMENTS

| | | |
|---|---|---|
| EP | 0 945 985 | 9/1999 |
| EP | 0 964 519 | 12/1999 |
| EP | 0 993 116 | 4/2000 |

OTHER PUBLICATIONS

*5–Volt Signal Level Shifter In A 3–Volt CMOS Circuit*, IBM Technical Disclosure Bulletin, IBM Corp., New York, US, vol. 32, No. 7, Dec. 1, 1989, pp. 454–455.

S. Shigematsu et al., *A 1–V High–Speed MTCMOS Circuit Scheme for Power–Down Application Circuits*, IEEE Journal of Solid–State Circuits, IEEE Inc. New York, US, vol. 32, No. 6, Jun. 1, 1997, pp. 861–869.

* cited by examiner

*Primary Examiner*—Minh Nguyen
(74) *Attorney, Agent, or Firm*—Trop, Pruner & Hu, P.C.

(57) ABSTRACT

A circuit includes an input terminal, an output terminal and a latch. The input terminal receives an input signal. The latch is programmable with a value. The latch communicates the input signal to the output terminal in response to the circuit not being in a sleep mode and in response to the circuit being in the sleep mode, furnishes a second signal to the output terminal indicative of the value.

15 Claims, 6 Drawing Sheets

CONTROLLING SIGNAL STATES AND LEAKAGE CURRENT DURING A SLEEP MODE

BACKGROUND

The invention generally relates to controlling signal states and leakage current during a sleep mode.

A computer (a palm top computer or notebook computer, as examples) may have at least one sleep mode to conserve power when the computer is not currently being used. In this sleep mode, one or more voltage supplies to a particular semiconductor package, or chip, of the computer may be cut off. For example, in a microprocessor of the computer, the low voltage core supply of the microprocessor may be shut off during the sleep mode while the high voltage core supply is left on to supply power to input/output (I/O) circuitry of the microprocessor.

The I/O circuitry is kept in a low power state during the sleep mode (instead of being shut down) to keep the external interface to the microprocessor enabled. For example, during the sleep mode, some output terminals of the I/O circuitry need to be held in specific high or low logic states while the core circuitry is shut off; and some input terminals of the I/O circuitry need to be enabled to permit a wakeup of the microprocessor from the sleep mode. However, some of this I/O circuitry may also need a low voltage supply to function properly. Thus, because the low voltage core supply is cut off, the microprocessor may include voltage regulators to generate the low supply voltages for the I/O circuitry from the high voltage core supply.

Figure 1:
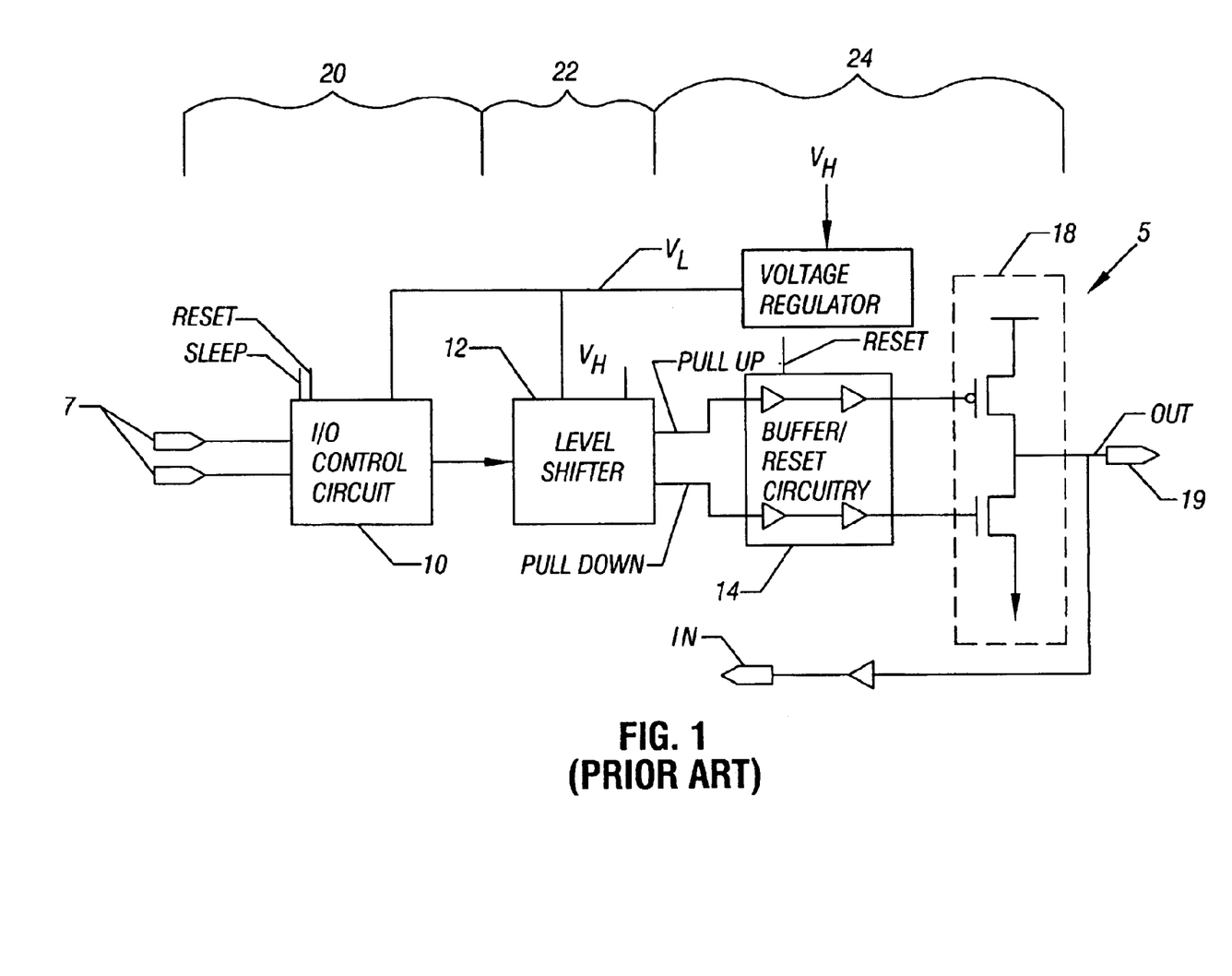
FIG. 1 is a schematic diagram of an I/O driver of the prior art.

As a more specific example, FIG. 1 depicts an I/O driver 5 that includes an I/O control circuit 10, a level shifter 12, buffer/reset circuitry 14 and a complementary output driver 18. The I/O control circuit 10 receives an input signal via input terminals 7. During a non-sleep mode, the I/O control circuit 10 furnishes a signal on its output terminal indicative of the voltage across the pins 7. The level shifter 12 translates the logic level of the signal from the I/O control circuit 10 and forms complementary signals (called PULLUP and PULLDOWN) to drive output circuitry 18 through the buffer/reset circuitry 14. An output terminal 19 of the output circuitry 18 provides an output signal indicative of the logic signal that appears across the input terminals 7.

During the sleep mode, circuitry of the I/O driver 5, such as the I/O control circuit 10 and the buffer/reset circuitry 14 may set the output signal of the driver 5 to a predetermined logic level or possibly even tri-state the output terminal 19. However, to power some of its low voltage circuitry during the sleep mode, the I/O driver 5 may include a voltage regulator 25 to replace the low voltage core supply that is cut off during the sleep mode.

For example, the I/O driver 5 may include approximately three different regions according to their power requirements: a region 20 in which components are powered via a low voltage core supply voltage (called $V_L$), a region 22 in which components are powered via the $V_L$ supply voltage and a higher voltage core supply voltage (called $V_H$); and a region 24 in which the components are powered via the $V_H$ supply voltage. As depicted in FIG. 1, as an example, the I/O control circuit 10 maybe located in the region 20; the level shifter 12 may be located in the region 22; and the buffer/reset circuitry 14 and output driver 18 may be located in the region 24. As an example, the $V_L$ supply voltage may be approximately 1 volt, and the $V_H$ supply voltage may be approximately 3.3 volts. The I/O driver 5 uses the voltage regulator 25 to generate the $V_L$ supply voltage for the regions 20 and 22, as depicted in FIG. 1.

A difficulty with the above-described arrangement is that the die space that is consumed by the I/O driver 5 is made significantly bigger with the inclusion of the voltage regulator 25. Furthermore, the use of the voltage regulator 25 increases the power that is dissipated during the sleep mode. An additional difficulty with the operation of such circuitry when a power supply is cut off, is the power dissipation that occurs due to leakage currents.

Thus, there is a continuing need for an arrangement to address one or more of the above-stated problems.

DETAILED DESCRIPTION

Figure 2:
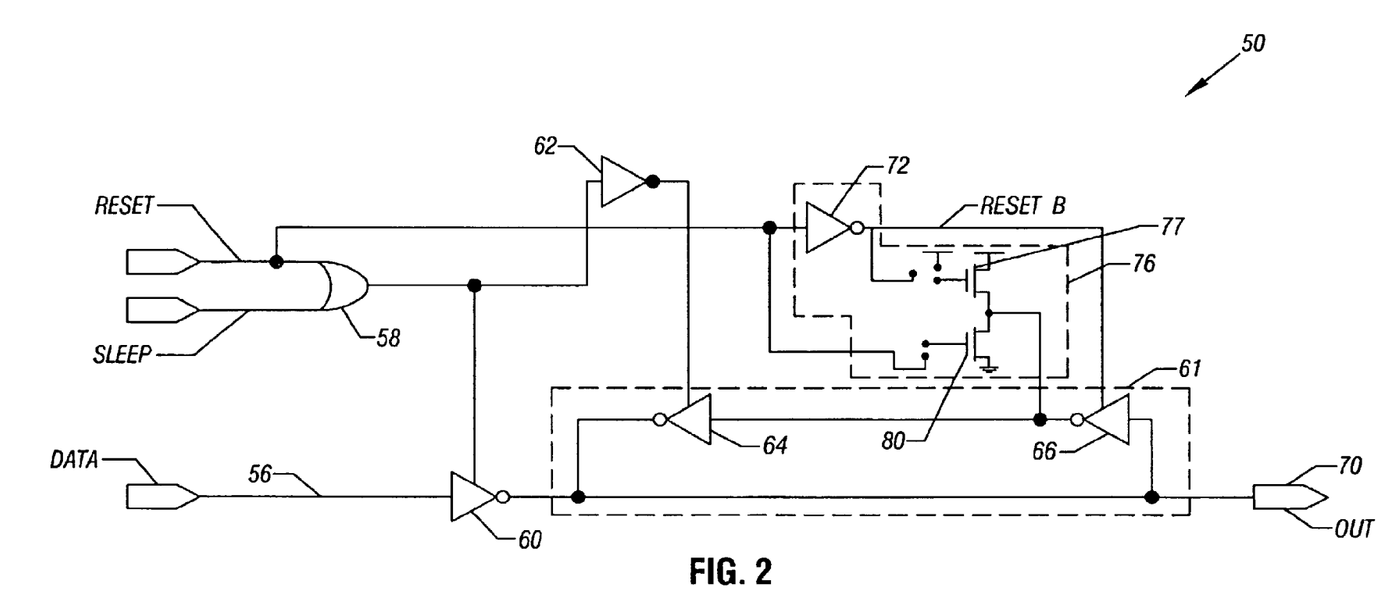
FIG. 2 is a schematic diagram of a latch according to an embodiment of the invention.

Referring to FIG. 2, an embodiment 50 of a latch in accordance with the invention is used to establish a predetermined logic state during a sleep mode. In this manner, the latch 50 is programmable with a bit, or value, to set the voltage level on an output terminal 70 of the latch 50 to a predetermined state during a sleep mode. However, when not in the sleep mode, the latch 50 communicates data through the latch 50 from its input terminal 56 to the output terminal 70. Therefore, as described below, the latch 50 may be used to program the logic level on a particular input or output terminal of an I/O device during the time when the device is placed in a sleep mode.

More particularly, the latch 50 includes an inverting driver 60 that controls communication between its input 56 and output 70 terminals. In this manner, the driver 60 communicates a one bit input signal (called DATA) from the input terminal 56 to the output terminal 70 when the latch 50 is not in the sleep mode or is not being reset. However, when the latch 50 is in the sleep mode or being reset, the latch 50 disables the driver 60 so that the signal present on the output terminal 70 is not provided by the signal on the input terminal 56 but is instead provided by a programmed value, as described below.

The driver 60 includes a tri-state input terminal that is connected to the output terminal of a NOR gate 58. One input terminal of the NOR gate 58 receives a signal (called RESET) that is asserted (driven high, for example) when the latch 50 is to be reset. Another input terminal of the NOR gate 58 receives a signal (called SLEEP) that is asserted (driven high, for example) when the latch 50 is in the sleep mode. Thus, due to this arrangement, when either the SLEEP signal or the RESET signal is asserted, the driver 60 is disabled and blocks communication between the input terminal 56 and the output terminal 70.

Figure 3:
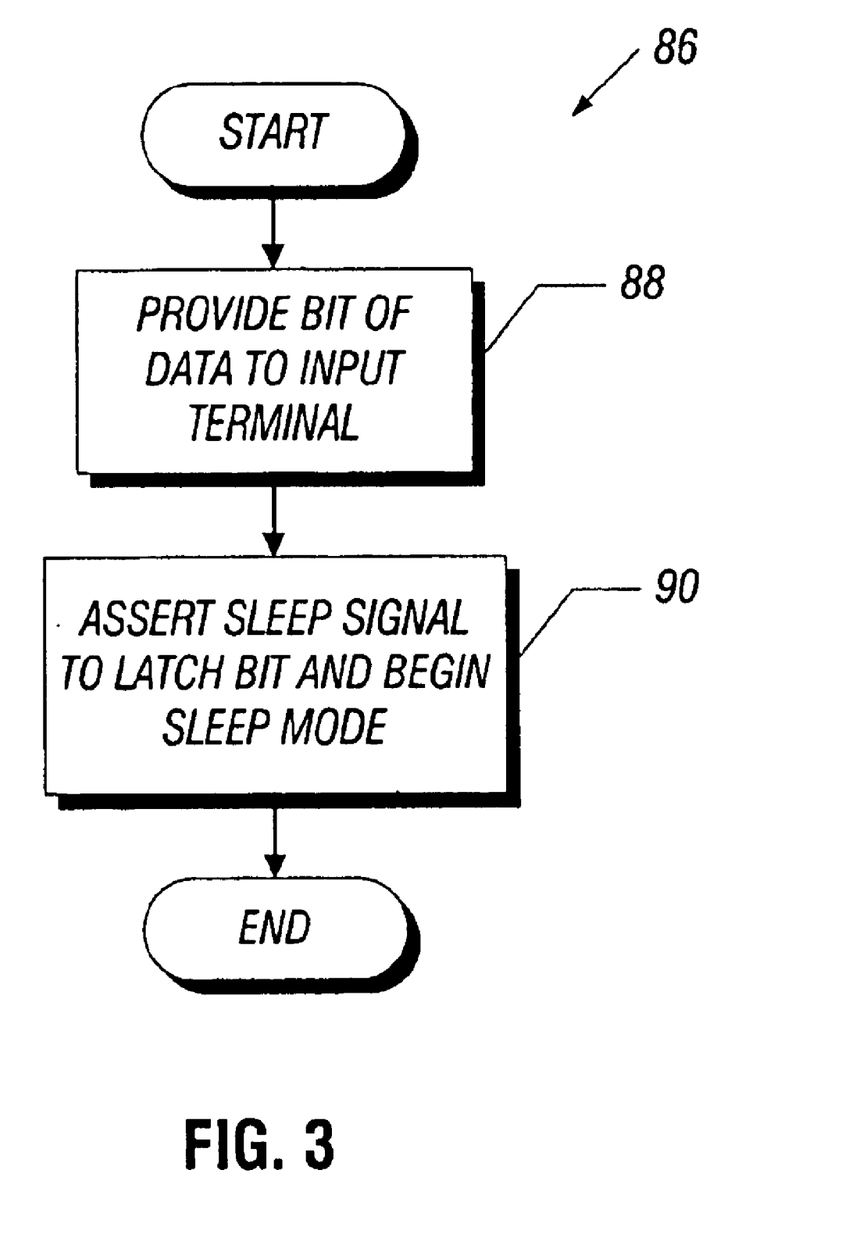
FIG. 3 is a flow diagram depicting a technique to program the latch for a sleep mode according to an embodiment of the invention.

When the SLEEP signal transitions from being deasserted to being asserted to begin the sleep mode, a latching circuit 61 of the latch 50 latches the current bit of data that is indicated by the signal (called OUT) on the output terminal 70 so that the OUT signal remains the same during the sleep mode. Thus, referring also to FIG. 3, a technique 86 that is depicted in FIG. 3 may be used to program the latch 50 to set the voltage level of the output terminal 70 to a particular logic level during the sleep mode.

In the technique 86, before the sleep mode begins, a bit of data is provided (block 88) to the latch 50 by providing the appropriate signal to the input terminal 56. Next, the SLEEP signal is asserted (block 90) while the signal that indicates the bit of data appears on the output terminal 70. In response to the assertion of the SLEEP signal, the latching circuit 61 latches the signal from the output terminal 70 (i.e., latches the bit) so that the same signal remains on the output terminal 70 during the entire SLEEP state.

Referring to FIG. 2, in some embodiments of the invention, the latching circuit 61 includes an inverting driver 66, an inverting driver 64 and an inverter 62. The input terminal of the driver 66 is coupled to the output terminal 70, and the output terminal of the driver 66 is coupled to the input terminal of the driver 64. The output terminal of the driver 64 is coupled to the output terminal 70. The tri-state terminal of the driver 64 is coupled to the output terminal of the inverter 62 that, in turn, has its input terminal coupled to the output terminal of the NOR gate 58.

When the SLEEP and RESET signals are both deasserted, the driver 64 is disabled, thereby disabling the latching circuit 61 and permitting direct communication between the input 56 and output 70 terminals. When the SLEEP signal is asserted and the RESET signal is deasserted, both the drivers 64 and 66 are enabled to cause the signal at the output terminal 70 to be latched.

When the RESET signal is asserted (regardless of the state of the SLEEP signal), circuitry 76 of the latch 50 sets the signal at the output terminal 70 to a predetermined reset logic level. To accomplish this, the circuitry 76 includes, for example, an N-channel metal-oxide-semiconductor field-effect-transistor (NMOSFET 80) and a P-channel metal-oxide-semiconductor field-effect-transistor (PMOSFET 77). The source terminal of the PMOSFET 77 is coupled to a positive voltage supply and the drain terminal of the PMOSFET 77 is coupled to the drain terminal of the NMOSFET 80. The source terminal of the NMOSFET 80 is coupled to ground. The drain terminals of the NMOSFET 80 and PMOSFET 77 are coupled to the input terminal of the driver 64.

The gate terminals of the NMOSFET 80 and the PMOSFET 77 are connected in a fashion to establish a predetermined logic level on the input terminal of the inverter 64 when the RESET signal is asserted. For example, to establish a logic one level on the input terminal of the inverter 64 when the RESET signal is asserted, the gate terminal of the PMOSFET 77 is coupled to the output terminal of an inverter 72 to receive a RESETB signal (the inverted RESET signal), and the gate terminal of the NMOSFET 80 is either coupled to a small bias voltage or coupled to the drain terminal of the NMOSFET 80 to form a resistor. As another example, to establish a logic zero level on the input terminal of the inverter 64 when the RESET signal is asserted, the gate terminal of the NMOSFET 80 is coupled to the input terminal 52 to receive the RESET signal, and the gate terminal of the PMOSFET 77 is either coupled to a small bias voltage or coupled to the drain terminal of the PMOSFET 77 to form a resistor.

Thus, due to the above described arrangement, when the RESET signal is asserted, the driver 66 is disabled to disable the latching circuit 61, and the voltage that appears on the output terminal 70 is controlled by the circuit 76. It is noted that after the RESET signal is deasserted, if the SLEEP signal is currently asserted, the voltage level established during the assertion of the RESET signal is then latched during the remainder of the sleep mode.

Figure 4:
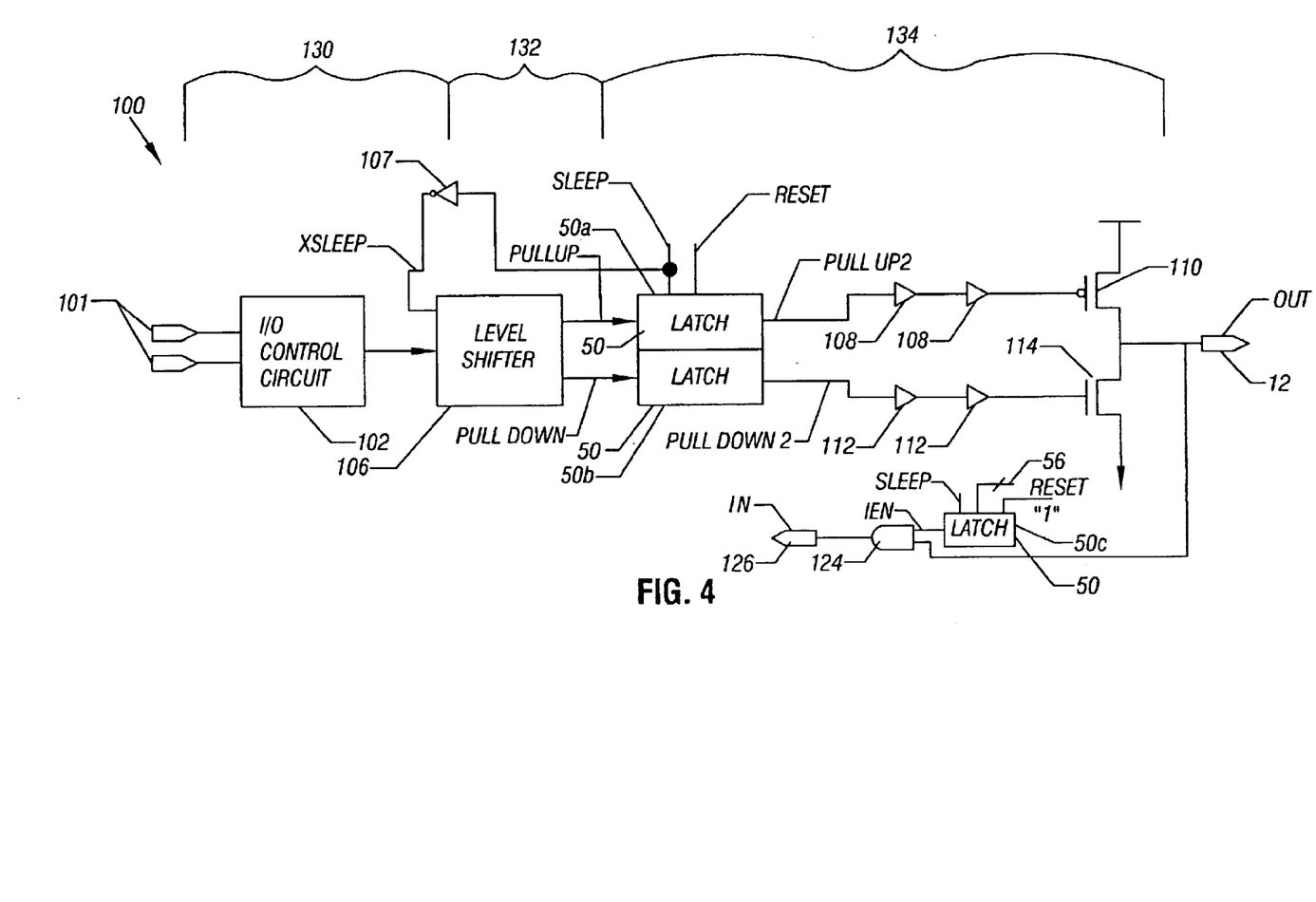
FIG. 4 is a schematic diagram of an I/O driver according to an embodiment of the invention.

As an example, the latch 50 may be used in circuitry, such as an I/O driver 100 that is depicted in FIG. 4. The I/O driver 100 includes two latches 50a and 50b that are located in a high supply voltage section 134 (a 3.3 volt powered section, for example) that stays fully powered up during the sleep mode of the driver 100. However, the latches 50a and 50b receive complementary logic signals (called PULLUP and PULLDOWN) from a level shifter 106, a circuit that is in the combined low and high supply voltage section 132 of the I/O driver 100. The level shifter 106 furnishes the PULLUP and PULLDOWN signals in response to a lower level logic signal (i.e., a signal that has a lower logic one level) that is furnished by an I/O control circuit 102 in response to signal present on input pins 101. The I/O control circuit 102 is located in the low voltage section 130. Thus, the I/O control circuit 102 and level shifter 106 may provide inaccurate signals during the sleep mode, as the I/O driver 100 does not include a voltage supply to power its lower voltage components when the low voltage core supply is shut off in the sleep mode.

However, the latch 50a ensures that a predetermined logic level is provided in place of the PULLUP signal upon reset and during the sleep mode, as described above. More particularly, the latch 50a furnishes a signal (called PULLUP2) that, during the normal operation of the driver 100 (outside of the sleep mode), follows the PULLUP signal. However, in response to a reset and during the sleep mode, the latch 50a sets the PULLUP2 signal to a programmed logic level regardless of the state of the PULLUP signal, as described above.

Similarly, the latch 50b ensures that a predetermined logic level is provided in place of the PULLDOWN signal upon reset and during the sleep mode, as described above. More particularly, the latch 50b furnishes a signal (called PULLDOWN2) that, during the normal operation of the driver 100 follows the PULLDOWN signal. However, in response to a reset and during the sleep mode, the latch 50b sets the PULLDOWN2 signal to a predetermined logic level (for reset) or a latched value (for the sleep mode) regardless of the state of the PULLDOWN signal, as described above.

The PULLUP2 signal drives (via buffers 108) an output PMOSFET 110, and the PULLDOWN2 signal drives (via buffers 112) an output NMOSFET 114. The source terminal of the PMOSFET 110 is coupled to a voltage supply, and the source terminal of the NMOSFET 114 is coupled to ground. The drain terminals of the NMOSFET 114 and PMOSFET 110 are coupled together to from an output terminal 120 of the I/O driver 100.

The latch 50 may be used in other circuitry outside of the I/O driver 100, such as in a latch 50c that, in conjunction with a NAND gate 124, regulates the voltage level of an input terminal 126 of an input buffer (not shown) in a reset and during the sleep mode. In this manner, the output terminal of the NAND gate 124 is coupled to the input terminal 126, one input terminal of the NAND gate 124 is coupled to receive a signal (called IEN) from the output terminal of the latch 50c, and another input terminal of the NAND gate 124 is coupled to the output terminal 120 of the I/O driver 100. During normal operation, the latch 50c communicates an input signal of logic one through the latch 50c to set the logic level of the IEN signal to the logic one level, a level that causes the NAND gate 124 to pass signals from the output terminal 120 of the I/O driver 100 to the input terminal 126 of the input buffer. However, in response to a reset or during the sleep mode, the latch 50c sets the logic level of the IEN signal to a predetermined logic zero level (for reset) or a latched value (for the sleep mode) to isolate the input terminal 126 from the output terminal 120.

Figure 5:
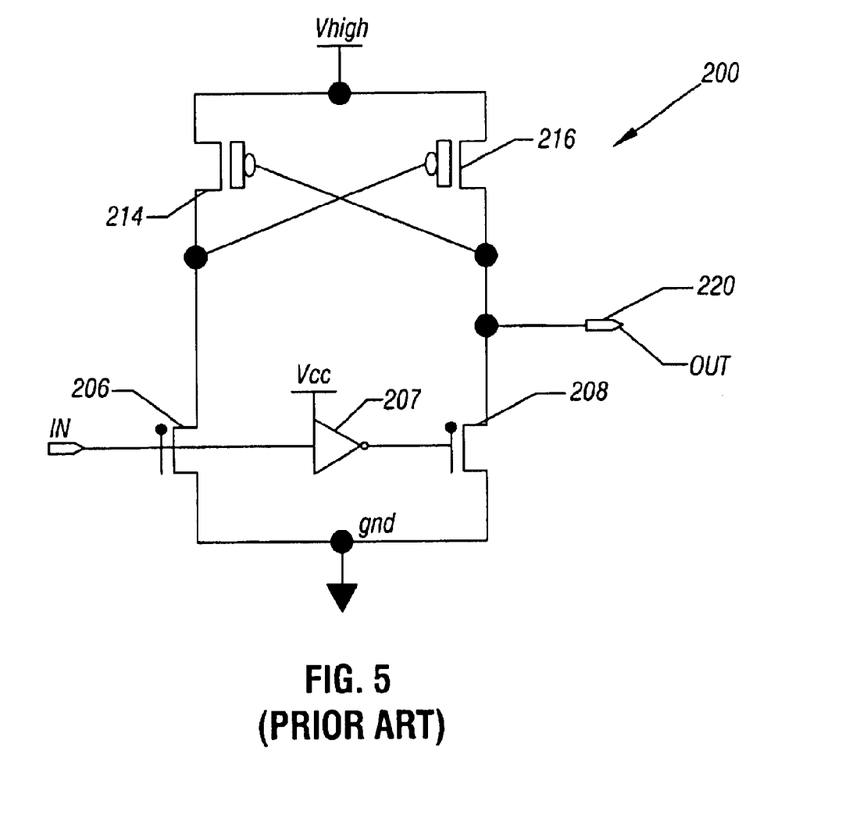
FIG. 5 is a schematic diagram of a level translator of the prior art.

The level shifter 106 may have one or more level translators to translate logic levels between its input and output terminals. In this manner, the input terminal of the level translators may receive a logic signal that uses a lower logic one level (1 volt, for example), as compared to the logic one level (3.3 volts, for example) that is associated with the signal at its output terminals. A conventional level translator 200 is depicted in FIG. 5. The translator 200 includes thin gate vertical drain N-channel metal-oxide-semiconductor field-effect-transistors (VDNMOSFETs) 206 and 208. The source terminals of both VDNMOSFETs 206 and 208 are coupled to ground. The gate terminal of the VDNMOSFET 206 receives an input signal (called IN), and the gate terminal of the VDNMOSFET 208 receives an inverted version of the IN signal, provided by an inverter 207 (powered by a low supply voltage (about 1 volt, for example). The IN signal has a low voltage (1 volt, as an example) logic one level, as compared to the voltage (3.3 volts, for example) of the logic one level of the signal (called OUT) that appears at an output terminal 220 of the level translator.

The drain terminal of the VDNMOSFET 206 is coupled to the drain terminal of a thick gate PMOSFET 214 and to the gate terminal of a thick gate PMOSFET 216. The source terminals of both PMOSFETs 214 and 216 are coupled to a supply voltage (called Vhigh) that corresponds to the higher logic one level of the OUT signal. The drain terminal of the PMOSFET 216 is coupled to the gate terminal of the PMOSFET 214, the output terminal 220 and the drain terminal of the VDNMOSFET 208.

Due to the above-described arrangement, when the IN signal has a logic zero level, the VDNMOSFET 206 does not conduct, and the VDMOSFET 208 conducts. The conduction of the VDNMOSFET 208, in turn, pulls the output terminal 220 to ground so that the OUT signal has a logic zero level. The logic zero level of the OUT signal, in turn, causes the PMOSFET 214 to conduct, a conduction that pulls the gate terminal of the PMOSFET 216 to the Vhigh voltage to prevent the PMOSFET 216 from conducting.

When the IN signal has a logic one level, the VDNMOSFET 206 conducts, and the VDMOSFET 208 does not conduct. The conduction of the VDNMOSFET 206, in turn, pulls the gate terminal of the PMOSFET 216 to a logic zero level to cause the PMOSFET 216 to conduct to pull the output terminal 220 to the Vhigh voltage and thus, cause the OUT signal to have a logic one level. The logic one level at the output terminal 220 causes the PMOSFET 214 to not conduct, thereby permitting the VDNMOSFET 206 to pull the gate terminal of the PMOSFET 216 to ground.

A difficulty with the above-described arrangement is that no provision is made for a sleep mode. In this manner, in the sleep mode, the Vhigh voltage may be left on while the gate terminals of the VDNMOSFETs 206 and 208 float due to the lower voltage power supply ($V_{CC}$, for example) being shut off. Under these circumstances, the gate terminals of the VDNMOSFETs 206 and 208 approach a threshold voltage ($V_T$) due to the leakage path created between each of the gate terminals and ground.

To prevent the leakage path to ground from forming, an embodiment 250 (see FIG. 6) of a level translator in accordance with the invention includes the transistors described above in addition to a thick gate VDNMOSFET 270. Instead of the source terminals of the VDNMOSFETs 206 and 208 being coupled to ground, these source terminals are coupled to the drain terminal of the VDNMOSFET 270. The gate terminal of the VDNMOSFET 270 receives a signal called XSLEEP, and the source terminal of the VDNMOSTFET 270 is coupled to ground.

Figure 6:
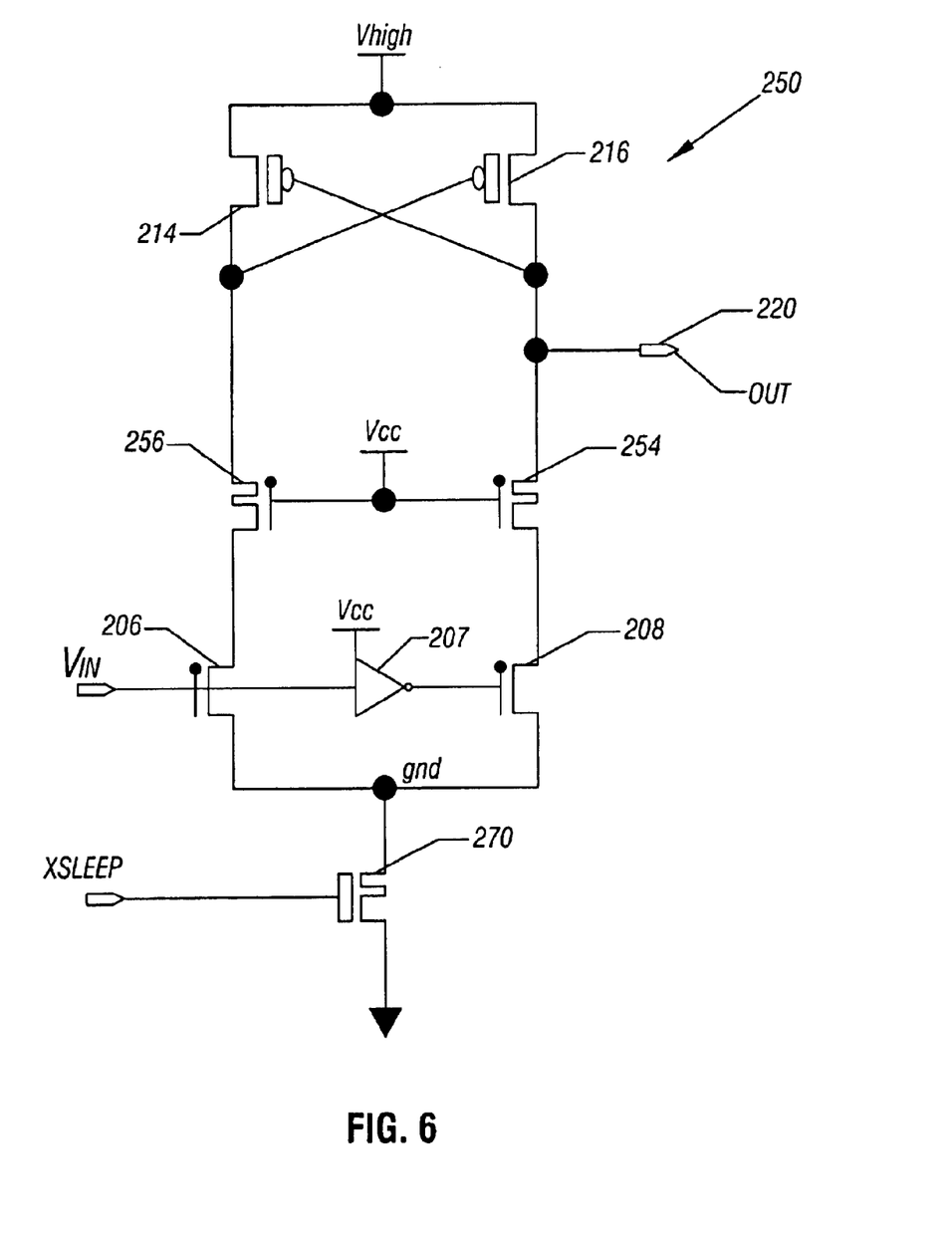
FIG. 6 is a schematic diagram of a level translator according to an embodiment of the invention.

The XSLEEP signal is the inverted SLEEP signal that is provided by an inverter 107 (see FIG. 4). When the XSLEEP signal is deasserted (driven low, for example) during the sleep mode, the level translator 250 is disabled, as described herein. Therefore, when the level translator 250 is used in the level shifter 106 (FIG. 4), the level shifter 106 is also disabled, thereby causing the PULLUP and PULLDOWN signals to be inaccurate during the sleep mode, as described above.

When the level translator 250 is not in the sleep mode, the XSLEEP signal is asserted (driven high, for example) to cause the VDNMOSFET 270 to conduct and establish a current path for the VDNMOSFET 206 or 208, depending on which transistor conducts. However, during the sleep mode, the XSLEEP signal is deasserted (driven low, for example) to cause the VDNMOSFET 270 to not conduct and thus, prevent the formation of a leakage current path to ground.

The VDNMOSFET 270 has a thicker gate oxide than either VDNMOSFET 206 or 208, thereby making it less prone to breakdown. Also, in addition to the relatively thick gate oxide, the VDNMOSFET 270 may have a threshold voltage (Vt) that is approximately 0.7 volts, and the VDN-MOSFETs 206 and 208 may each have a threshold voltage near approximately 0.3 volts.

In some embodiments of the invention, the level translator also includes an isolation thin gate VDMOSFET 256 that has its drain-source path coupled between the drain terminals of the PMOSFET 214 and VDNMOSFET 206; and another isolation thin gate VDNMOSFET 254 that has its drain-source path coupled between the drain terminals of the PMOSFET 216 and VDNMOSFET 208. The gate terminals of the VDNMOSFETs 206 and 208 are coupled to the $V_{CC}$ supply voltage. The VDNMOSFETs 254 and 256 are high drain voltage tolerant, thin gate devices to provide protection of N-channels of the VDNMOSFETs 206 and 208 below against high voltages.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A circuit comprising:
    an input terminal to receive an input signal;
    an output terminal;
    a latch programmable with a value, the latch to communicate the input signal to the output terminal in response to the circuit not being in a sleep mode and in response to the circuit being in the sleep mode, furnish another signal to the output terminal indicative of the value.

2. The circuit of claim 1, wherein the latch stores the value in response to the circuit transitioning into the sleep mode.

3. The circuit of claim 1, wherein the value indicates the input signal when the circuit transitions into the sleep mode.

4. The circuit of claim 1, wherein the latch furnishes a predetermined signal to the output terminal in response to the circuit being reset.

5. The circuit of claim 4, wherein the latch furnishes the predetermined signal to the output terminal regardless of whether the circuit is in the sleep mode.

6. A driver circuit comprising:

a level shifter to generate at least one signal indicative of an input signal to the driver circuit in response to the driver circuit not being in a sleep mode;

an output circuit to generate an output signal; and a latch programmable with a value, the latch to cause the output circuit to generate a first signal indicative of the input signal in response to the driver circuit not being in the sleep mode and cause the output circuit to generate a second signal indicative of the value in response to the driver circuit being in the sleep mode.

7. The driver circuit of claim 6, wherein the latch stores the value in response to the circuit transitioning into the sleep mode to form the second signal.

8. The driver circuit of claim 6, wherein the value indicates the input signal when the circuit transitions into the sleep mode.

9. The driver circuit of claim 6, wherein the latch causes the output circuit to furnish a predetermined signal in response to the circuit being reset.

10. The driver circuit of claim 9, wherein the latch causes the output circuit to furnish the predetermined signal regardless of whether the circuit is in the sleep mode.

11. The driver circuit of claim 6, wherein the level shifter is disabled in the sleep mode.

12. A method comprising:

receiving an input signal;

communicating the input signal to an output terminal in response to the non-occurrence of a sleep mode;

programming a latch with a value indicative of another signal; and in response to the sleep mode, communicating said another signal to the output terminal.

13. The method of claim 12, wherein the programming comprises: storing the value in the latch in response to the beginning of the sleep mode.

14. The method of claim 12, wherein the value indicates the input signal at the beginning of the sleep mode.

15. The method of claim 12, further comprising:

furnishing a predetermined signal to the output terminal in response to a reset mode.

* * * * *